(12) United States Patent
Yoo

(10) Patent No.: US 9,565,379 B2
(45) Date of Patent: Feb. 7, 2017

(54) RAMP SIGNAL GENERATOR AND CMOS IMAGE SENSOR HAVING THE SAME

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 242 days.

(21) Appl. No.: 14/460,777

(22) Filed: Aug. 15, 2014

(65) Prior Publication Data

US 2015/0264284 A1  Sep. 17, 2015

(30) Foreign Application Priority Data

Mar. 17, 2014  (KR) .................... 10-2014-0030904

(51) Int. Cl.
| | |
|---|---|
| H04N 5/363 | (2011.01) |
| H04N 5/378 | (2011.01) |
| H03M 1/56 | (2006.01) |
| H03K 4/50 | (2006.01) |

(52) U.S. Cl.
CPC ............. *H04N 5/363* (2013.01); *H03K 4/50* (2013.01); *H03M 1/56* (2013.01); *H04N 5/378* (2013.01)

(58) Field of Classification Search
None
See application file for complete search history.

(56) References Cited

U.S. PATENT DOCUMENTS

| | | | | |
|---|---|---|---|---|
| 7,218,265 | B2* | 5/2007 | Roh ...................... | H03M 1/181 341/155 |
| 7,616,146 | B2* | 11/2009 | Sakakibara ......... | H03M 1/0658 341/155 |
| 8,174,422 | B2* | 5/2012 | Okamoto ........... | H04N 5/37457 341/118 |
| 2014/0055176 | A1* | 2/2014 | Zhang ..................... | H03K 4/00 327/137 |
| 2016/0014363 | A1* | 1/2016 | Kito ....................... | H04N 5/378 348/308 |

* cited by examiner

*Primary Examiner* — Howard Williams
(74) *Attorney, Agent, or Firm* — IP & T Group LLP

(57) ABSTRACT

A ramp signal generator may include a ramp signal generation unit suitable for generating a ramp signal and a gain amplification control signal, an overlap voltage generation unit suitable for generating an overlap voltage to be overlapped with the ramp signal, and a voltage overlapping unit suitable for controlling a voltage gain by amplifying the ramp signal according to the gain amplification control signal, and overlapping the overlap voltage with the ramp signal.

15 Claims, 2 Drawing Sheets

RAMP SIGNAL GENERATOR AND CMOS IMAGE SENSOR HAVING THE SAME

CROSS-REFERENCE TO RELATED APPLICATIONS

The present application claims priority of Korean Patent Application No. 10-2014-0030904, filed on Mar. 17, 2014, which is incorporated herein by reference in its entirety.

BACKGROUND

1. Field

Exemplary embodiments of the present invention relate to a complementary metal oxide semiconductor (CMOS) image sensor and, more particularly, to a ramp signal generator having a voltage overlapping function and noise cancellation in a CMOS image sensor.

In the embodiments of the present invention, as an example, replica noise that copies pixel power noise will be discussed. Power noise is one of main contributors to the horizontal noise generated in a CMOS image sensor. In the embodiments, replica noise copying the power noise of a pixel is overlapped with a ramp signal through a voltage overlapping function. However, the applications of the present invention are not limited to this example.

2. Description of the Related Art

In the typical column parallel structure of a CMOS image sensor, noise may be generated due by the supply voltage the read-out circuit comparators, which operate in differential mode, and may be effectively removed through operations in a common mode.

However, since power noise generated from a pixel may be contained in a pixel signal and then applied to the read-out circuit, the power noise may not be removed through the read-out circuit, but may be contained in the outputted pixel data.

The power noise of the pixel may include supply power noise or ground power noise. Furthermore, the power noise may include supply power noise and ground power noise, which are overlapped through a specific circuit. In addition, the power noise may include all types of power noises generated from a pixel array.

Since power noise generated from a pixel array is a main contributor of overall noise, the power noise needs to be removed or suppressed as much as possible.

SUMMARY

Various embodiments are directed to a ramp signal generator that may cancel various noises (or voltages) by overlapping it with a ramp signal, and a CMOS image sensor having the same.

That is, various embodiments are directed to a ramp signal generator that overlaps replica noise copying power noise of a pixel, which is one of main factors of horizontal noise generated in a CMOS image sensor, or various voltages such as an offset voltage with a ramp signal using a voltage overlapping function, and differentially cancels the noise or voltages from the viewpoint of the comparator's input, and a CMOS image sensor having the same.

In an embodiment, a ramp signal generator may include: a ramp signal generation unit suitable for generating a ramp signal and a gain amplification control signal; an overlap voltage generation unit suitable for generating an overlap voltage to be overlapped with the ramp signal; and a voltage overlapping unit suitable for controlling a voltage gain by amplifying the ramp signal according to the gain amplification control signal, and overlapping the overlap voltage with the ramp signal.

In an embodiment, a CMOS image sensor may include: a pixel array suitable for generating a pixel signal; a ramp signal generation unit suitable for generating a ramp signal and a gain amplification control signal; an overlap voltage generation unit suitable for generating an overlap voltage to be overlapped with the ramp signal; a voltage overlapping unit suitable for controlling a voltage gain by amplifying the ramp signal according to the gain amplification control signal, and overlapping the overlap voltage with the ramp signal; and a comparison unit suitable for comparing the pixel signal to the ramp signal that is overlapped with the overlap voltage.

In an embodiment, a CMOS image sensor may include: a pixel array suitable for generating a pixel signal; a ramp signal generator suitable for generating a ramp signal by using replica noise, which copies noise of the pixel array; and a comparison unit suitable for comparing the pixel signal to the ramp signal that is overlapped with the overlap voltage.

DETAILED DESCRIPTION

Figure 1:
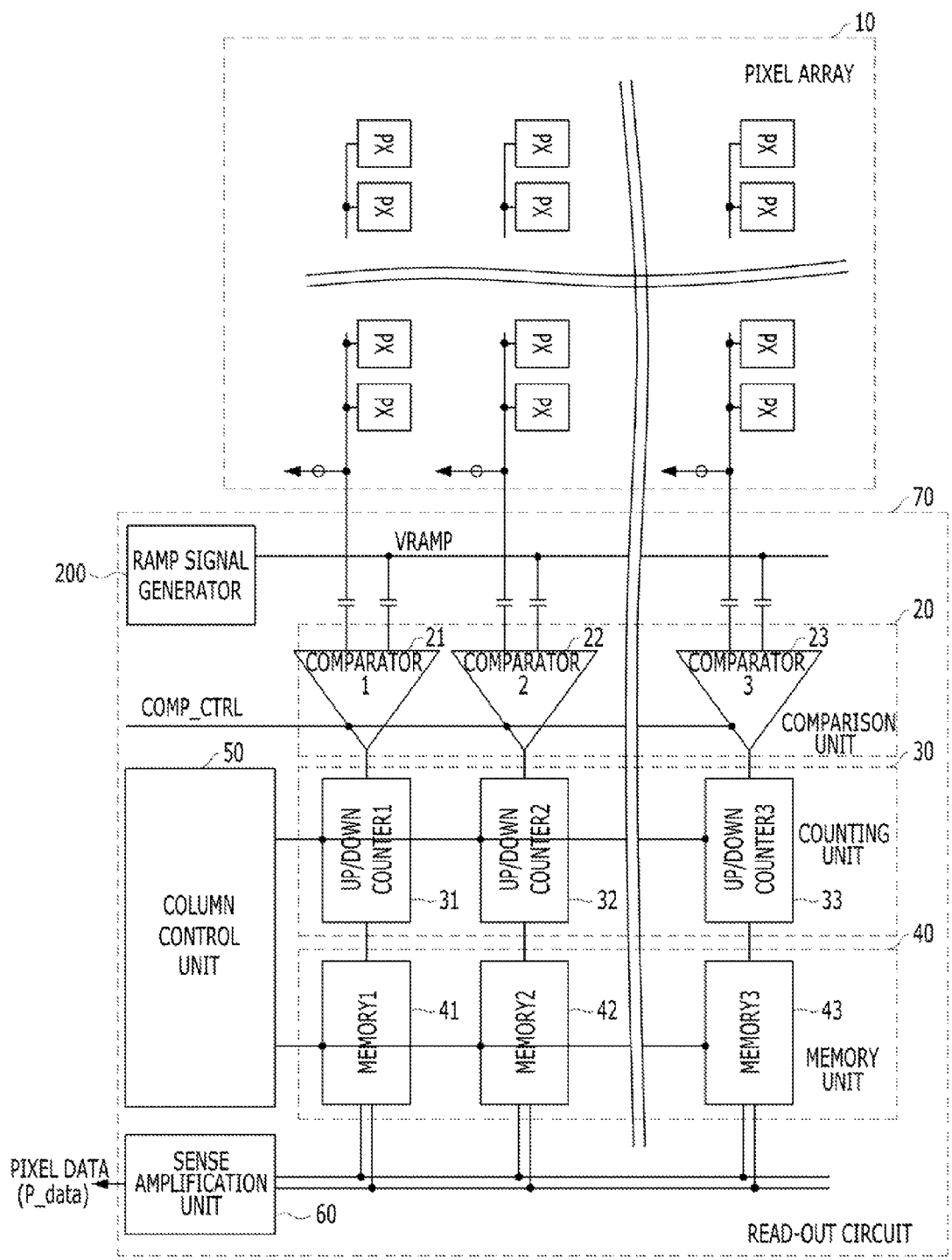
FIG. 1 is a block diagram illustrating a CMOS image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when an element is referred to as being "coupled" to another element, the element may be "directly coupled" to another element, and/or "electrically coupled" to the another element with another element interposed therebetween. Furthermore, when it is described that something "comprises" (or "includes" or "has") elements, it should be understood that it may have (or include or has) only those elements, or it may have (or include or have) other elements as well as those elements, if there is no specific limitation. The terms of a singular form may include the plural form, and vice versa, unless specified otherwise.

FIG. 1 is a block diagram illustrating a CMOS image sensor in accordance with an embodiment of the present invention. FIG. 1 illustrates a general column parallel structure.

As illustrated in FIG. 1, the CMOS image sensor may include a pixel array 10 and a read-output circuit 70. The read-output circuit 70 may include a comparison unit 20, a counting unit 30, a memory unit 40, a column control unit 50, a sense amplification unit 60, and a ramp signal generator 200. The pixel array 10 outputs a pixel signal corresponding to incident light. The comparison unit 20 compares the value of the pixel signal outputted from the pixel array 10 to the value of a ramp signal VRAMP outputted from the ramp signal generator 200 in response to a comparator control signal COMP_CTRL received from a controller (not illustrated in FIG. 1). The counting unit 30 counts an output signal of the comparison unit 20. The memory unit 40 stores counting information provided from the counting unit 30. The column control unit 50 controls the operations of the counting unit 30 and the memory unit 40. The sense amplification unit 60 amplifies a signal corresponding to data outputted from the memory unit 40 and outputs the amplified signal as pixel data P_data.

The comparison unit 20 includes a plurality of comparators 21 to 23, the counting unit 30 includes a plurality of up/down counters 31 to 33, and the memory unit 40 includes a plurality of memories 41 to 43. In another embodiment, memories may be used instead of the up/down counters 31 to 33.

An operation (i.e., an analog-to-digital conversion operation) performed by one comparator 21, one up/down counter 31, and one memory 41 will now be described.

The comparator 21 receives a pixel signal outputted from a first column pixel of the pixel array 10 through one terminal thereof, receives the ramp signal VRAMP generated from the ramp signal generator 200 through the other terminal thereof, and compares the values of the two signals in response to the comparator control signal COMP_CTRL.

Since the voltage level of the ramp signal VRAMP gradually decreases as time passes, the values of the two signals inputted to the comparator 21 coincide with each other at a certain point in time. When the values of the two signals coincide with each other, an output signal of the comparator 21 is inverted.

Thus, the up/down counter 31 counts the output signal until the output signal of the comparator 21 is inverted.

Then, the memory 41 stores the value (i.e., the counting information) counted by the up/down counter 31 and outputs the counting information.

As such, the column parallel structure includes an analog-to-digital converter (ADC) provided for each column, compares the value of a pixel signal outputted from each pixel to the value of the ramp signal VRAMP applied from the ramp signal generator 200 in response to the comparator control signal COMP_CTRL, performs counting until each of the comparators judges and outputs the value.

By using a common mode, the noise, which is generated due to a comparator supply voltage of each of the comparators operating in a differential mode, may be effectively removed.

However, since power noise generated from the pixel may be contained in the pixel signal and applied to the read-out circuit 70, the power noise may not be removed through the read-out circuit 70, but be contained in pixel data P_data to be outputted.

Since the power noise of the pixel is one of main factors that generates horizontal noise in the CMOS image sensor, the power noise needs to be removed or suppressed as much as possible.

The ramp signal generator 200 in accordance with an embodiment of the present invention may overlap replica noise having the same or similar form as the power noise of the pixel (i.e., copying the power noise of the pixel) or various voltages, such as an offset voltage, with a ramp signal using a voltage overlapping function, to differentially remove the noise from the viewpoint of the comparator's input. This operation will be described in detail with reference to FIG. 2.

Figure 2:
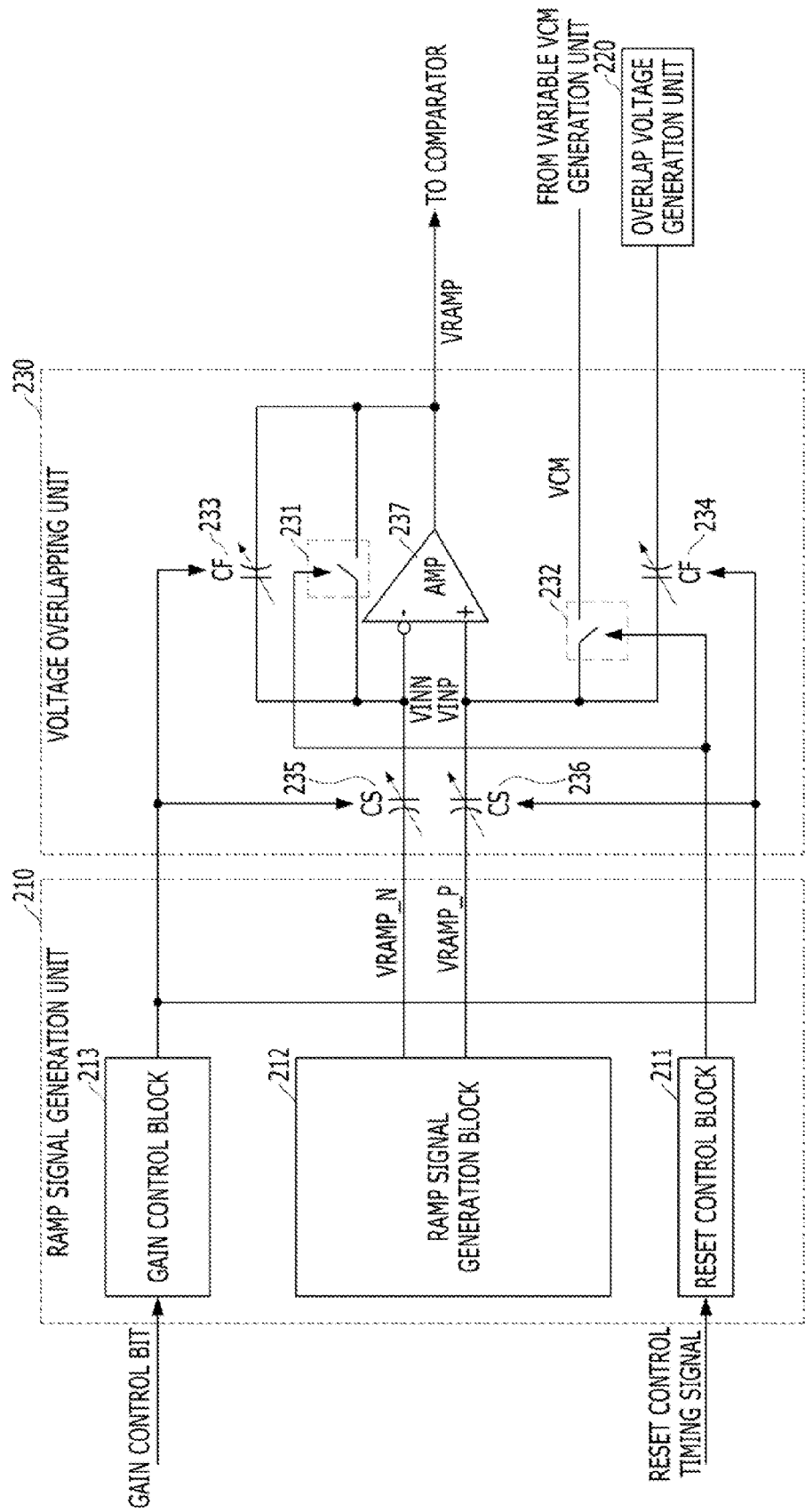
FIG. 2 is a detailed diagram of a ramp signal generator shown in FIG. 1.

FIG. 2 is a detailed diagram of the ramp signal generator 200 shown in FIG. 1. FIG. 2 illustrates a scheme in which replica noise copying power noise of a pixel may overlap with a ramp signal using a voltage overlapping function and differentially cancel the power noise from the point of view of a comparator's input.

As illustrate in FIG. 2, the ramp signal generator 200 may include a ramp signal generation unit 210, an overlap voltage generation unit 220, and a voltage overlapping unit 230. The ramp signal generation unit 210 generates source ramp signals and a gain amplification control signal. The overlap voltage generation unit 220 generates an overlap voltage to be overlapped with the source ramp signals. The voltage overlapping unit 230 controls a voltage gain by amplifying the source ramp signals provided according to the gain amplification control signal, and overlaps the overlap voltage provided from the overlap voltage generation unit 220 with the source ramp signals. The power noise of the pixel may be incorporated in the overlap voltage as replica noise.

The ramp signal generation unit 210 includes a reset control block 211, a ramp signal generation block 212, and a gain control block 213. The reset control block 211 outputs a switch control signal to the voltage overlapping unit 230 according to a reset control signal from a control unit (not illustrated). The ramp signal generation block 212 generates source ramp signals VRAMP_N and VRAMP_P and applies the generated source ramp signals VRAMP_N and VRAMP_P to the voltage overlapping unit 230. The gain control block 213 outputs a capacitor control signal to the voltage overlapping unit 230 according to a gain control signal from the control unit.

The reset control block 211 generates a switch control signal for turning on or off a reset switch 231 and an initialization switch 232 of the voltage overlapping unit 230 according to the reset control signal, and controls the reset switch 231 and the initialization switch 232 of the voltage overlapping unit 230. The reset control signal provided from the control unit is a reset control timing signal, which is activated one time as a pulse before each row of the CMOS image sensor starts a read-out operation, and is received from the control unit within a CMOS image sensor chip. The control unit may include a digital core block.

The ramp signal generation block 212 is a circuit which generates the source ramp signals VRAMP_N and VRAMP_P used as a reference voltage for the ramp signal VRAMP and applies the generated source ramp signals VRAMP_N and VRAMP_P to one terminal (e.g., a negative terminal) and the other terminal (positive terminal) of the differential amplifier 237 of the voltage overlapping unit 230, and may be implemented with a well-known current steering digital-to-analog converter (DAC). Since a gain control function, which had been performed in the current steering DAC, is transferred to the voltage overlapping unit 230 at an output terminal of the ramp signal generation unit 210 such that the voltage overlapping unit 230 performs the gain control function, the current steering DAC used in the embodiment of the present invention does not perform the gain control function.

The gain control block 213 generates a capacitor control signal for controlling a feedback capacitor value (i.e., a capacitance of a feedback capacitor) and a sampling capacitor value (i.e., a capacitance of a sampling capacitor) of the voltage overlapping unit 230 or controlling the feedback capacitor value according to the gain control signal from the control unit, and outputs the generated capacitor control signal to first and second feedback capacitors 233 and 234 and first and second sampling capacitors 235 and 236 of the voltage overlapping unit 230 or outputs the generated capacitor control signal to the first and second feedback capacitors 233 and 234. The gain control signal provided from the control unit is a gain control bit having a value 0 or 1, and is received from the control unit within the CMOS image sensor chip. Then, the gain control block 213 generates a capacitor control signal for increasing or decreasing the feedback capacitor value (CF) and the sampling capacitor value (CS) or increasing or decreasing the feedback capacitor value (CF) according to the value of the gain control bit, and outputs the generated capacitor control signal to the first and second feedback capacitors 233 and 234 and the first and second sampling capacitors 235 and 236 or outputs the generated capacitor control signal to the first and second feedback capacitors 233 and 234. Thus, the amplification gain linearly increases or decreases, as expressed by Equation 1 below. The control unit may include a digital core block.

Furthermore, in the case of gain control for the voltage overlapping unit 230, the voltage amplification gain is not changed while the voltage overlapping unit 230 operates, but is previously set before one frame of the CMOS image sensor is performed. That is, the digital core block of the CMOS image sensor may determine the voltage amplification gain according to the brightness of the surrounding environment.

Now, a common mode voltage (VCM) will be described as follows. A variable VCM generation unit variably generates a common mode voltage according to a VCM level control bit from the control unit, and applies the generated common mode voltage to the differential amplifier 237 through the initialization switch 232 of the voltage overlapping unit 230. The VCM level control bit includes 0 or 1, and is received from the control unit within the CMOS image sensor chip. Then, the variable VCM generation unit variably generates the common mode voltage to increase or decrease according to the VCM level control bit including 0 or 1, and applies the generated common mode voltage to the other terminal (positive terminal) of the differential amplifier 237 through the initialization switch 232. The generated common mode voltage linearly increases or decreases according to the VCM level control bit including 0 or 1. The control unit may include a digital core block.

The overlap voltage generation unit 220 generates an overlap voltage to overlap with the source ramp signals VRAMP_N and VRAMP_P provided from the ramp signal generation unit 210, and outputs the generated overlap voltage to the voltage overlapping unit 230. The overlap voltage may include replica noise copying power noise of a pixel or various voltages such as an offset voltage. The power noise of the pixel may include supply power noise or ground power noise. Furthermore, the power noise may include supply power noise and ground power noise, which are overlapped through a specific circuit. More inclusively, the power noise may include all types of power noise generated from a pixel array.

For example, the power noise of the pixel may include a voltage to which the power noise of the pixel is added on the basis of an arbitrary DC voltage. The power noise of the pixel may include power noise that is applied as an AC voltage to a floating diffusion node of the pixel.

For example, the overlap voltage generation unit 220 may be implemented in such a manner that all power noise appears as an output of a source follower through pixel modeling. In a pixel, a floating diffusion node may be most significantly influenced by power noise. At a node modeled to correspond to the floating diffusion node, various powers used in the pixel may be coupled to a capacitor. Furthermore, RC delay may be modeled, and power adjacent to a pixel output line used in the pixel array may be used for modeling.

The voltage overlapping unit 230 controls a voltage gain by amplifying the source ramp signals VRAMP_N and VRAMP_P provided from the ramp signal generation unit 210 at the ratio of a capacitor value controlled according to the gain amplification control signal from the ramp signal generation unit 210, and overlaps the overlap voltage provided from the overlap voltage generation unit 220 with the source ramp signals VRAMP_N and VRAMP_P provided from the ramp signal generation unit 210. The voltage overlapping unit 230 may include a voltage buffer or a programmable gain amplifier (PGA).

The voltage overlapping unit 230 includes a switching block including the reset switch 231 and the initialization switch 232, a feedback capacitor block including the first and second feedback capacitors 233 and 234, a sampling capacitor block including the first and second sampling capacitors 235 and 236, and a differential amplifier 237. The switching block initializes the differential amplifier 237 to the common mode voltage provided from the variable VCM generator according to the switch control signal provided from the reset control block 211. The feedback capacitor block controls the feedback capacitor value (CF) according to the capacitor control signal from the gain control block 213. The sampling capacitor block samples the source ramp signals VRAMP_N and VRAMP_P provided from the ramp signal generation block 212. The differential amplifier 237 amplifies the source ramp signals VRAMP_N and VRAMP_P sampled through the sampling capacitor block 235 and 236 according to the ratio of the value of the sampling capacitor block 235 and 236 and the value of the feedback capacitor block 233 and 234 (CS/CF), and outputs the amplified ramp signal VRAMP.

The reset switch 231 is provided between one terminal and an output terminal of the differential amplifier 237, and the initialization switch 232 is provided between the other terminal of the differential amplifier 237 and the variable VCM generation unit. When the switch control signal provided from the reset control block 211 is turned on, the reset switch 231 and the initialization switch 232 are closed. Thus, a closed loop feedback network is formed in the voltage overlapping unit 230 such that one input node VINN, the other input node VINP, and an output node VRAMP of the differential amplifier 237 have the same level as the level of the common mode voltage inputted to the other terminal of the differential amplifier 237 from the variable VCM generation unit. This means that the operating points (potentials) of the input node and the output node of the differential amplifier 237 are reset to the level of the common mode voltage because the differential amplifier 237 needs to have a proper operating point in order to normally operate. The reason that the variable VCM generation unit is used to apply a variable function is in order to prevent a malfunction of the differential amplifier 237, which may occur when the differential amplifier 237 does not have a proper voltage.

The first feedback capacitor 233 is provided between the one terminal and the output stage of the differential amplifier 237, and the second feedback capacitor 234 is provided between the other stage of the differential amplifier 237 and the overlap voltage generation unit 220. The values (amounts) of the first and second feedback capacitors 233 and 234 are controlled to increase or decrease according to the capacitor control signal from the gain control block 213. The first and second feedback capacitors 233 and 234 may be implemented with a combination of a plurality of capacitors and switches (not illustrated), and each of the switches may be opened/closed to determine whether to use the corresponding capacitor.

The first sampling capacitor 235 is provided between the output terminal of the ramp signal generation block 212 and the one terminal of the differential amplifier 237, and the second sampling capacitor 236 is provided between the output terminal of the ramp signal generation block 212 and the other terminal of the differential amplifier 237. The values (amounts) of the first and second sampling capacitors 235 and 236 are controlled to increase or decrease according to the capacitor control signal from the gain control block 213. The first and second sampling capacitors 235 and 236 may have a fixed capacitor value.

The differential amplifier 237 is an inverting differential amplifier which inverts the input of the one terminal (negative terminal) thereof. As the reset switch 231 and the initialization switch 232 are turned on, the differential amplifier 237 is initialized to the level of the common mode voltage inputted to the other terminal thereof. Then, when the ramp signal sampled through the first and second sampling capacitors 235 and 236 is inputted to the one terminal and the other terminal, the differential amplifier 237 amplifies the ramp signal according to the ratio of the value of the sampling capacitor block 235 and 236 and the value of the feedback capacitor 233 and 234 (CS/CF), and outputs the amplified ramp signal VRAMP.

Thus, the voltage amplification gain Gv is determined according to the ratio of the sampling capacitor value (CS) and the feedback capacitor value (CF), as expressed by Equation 1 below.

$$Gv = CS/CF \qquad \text{[Equation 1]}$$

Now, a case in which power noise is applied to the other terminal of the differential amplifier 237 through the second feedback capacitor 234 from the overlap voltage generation unit 220 will be described as follows.

When power noise is applied from the overlap voltage generation unit 220 in a state where the second feedback capacitor 234 is turned on, the power noise is divided by "CF/(CS+CF)" and applied to the other terminal of the differential amplifier 237. Since the other terminal is a virtual ground, one input terminal of two input terminals of the differential amplifier 237 is moved by the same magnitude. According to the movement of the noise, the output of the differential amplifier 237 may change the voltage having the same amplitude as the voltage of the power noise applied from the overlap voltage generation unit 220. As a result, the overlap voltage is overlapped with the ramp voltage VRAMP outputted from the differential amplifier 237 (2* (CS+CF)*VRAMP+power noise).

That is, when the power noise is applied as described above, an AC component of the power noise, that is, the power noise of the pixel is transmitted to the output terminal of the differential amplifier 237. This principle will be described later in more detail.

When the power noise is applied as described above, the power noise is divided by "CF/(CS+CF)" and applied to the other terminal VINP of the differential amplifier 237. The change (refer to Equation 2) is transmitted to the one terminal VINN of the differential amplifier 237 because the voltage overlapping unit 230 is a negative feedback circuit.

charge changes in each of VIN [Equation 2]

N node and VINP node by power noise (i.e., AC component) = [CF/(CS + CF)] * power noise * (CS + CF) = CF * power noise

Here, the charge caused by the change of the one terminal VINN of the differential amplifier 237 is transmitted to the first feedback capacitor 233 to form a voltage having the same magnitude as the power noise at the output terminal of the differential amplifier 237.

That is, the charge transmitted to the output terminal of the differential amplifier 237 becomes (CF*power noise). Thus, the voltage outputted from the differential amplifier 237 by the power noise may be expressed by Equation 3 below, according to a well-known formula: Q (charge)=C (capacitance)*V (voltage).

'output voltage caused by power noise' = [Equation 3]

(CF * power noise)/CF = power noise

That is, the input power noise is transmitted to the output terminal regardless of the gain of the voltage overlapping unit 230.

As described above, the embodiment of the present invention may remove power noise of a pixel. Furthermore, since the circuit for overlapping power noise with the ramp signal may be implemented with the existing voltage buffer or PGA to drive a load, additional circuits and current consumption are not needed. Furthermore, the embodiment of the present invention may overlap a constant magnitude of noise, regardless of the ramp slope and the gain control of the PGA.

Although various embodiments have been described for illustrative purposes, it will be apparent to those skilled in the art that various changes and modifications may be made without departing from the spirit and scope of the invention as defined in the following claims.

What is claimed is:

1. A ramp signal generator comprising:
    a ramp signal generation unit suitable for generating a ramp signal and a gain amplification control signal;
    an overlap voltage generation unit suitable for generating an overlap voltage to be overlapped with the ramp signal; and
    a voltage overlapping unit suitable for controlling a voltage gain by amplifying the ramp signal according to the gain amplification control signal, and overlapping the overlap voltage with the ramp signal,
    wherein the voltage overlapping unit comprises:
        a switching block suitable for initializing a differential amplifier to a common mode voltage provided from a variable common mode voltage generation unit according to a switch control signal from the ramp signal generation unit;
        a feedback capacitor block having a feedback capacitor value, which is controlled according to a capacitor control signal from the ramp signal generation unit;
        a sampling capacitor block suitable for sampling the ramp signal; and
        wherein the differential amplifier is suitable for amplifying the ramp signal sampled through the sampling capacitor block according to a ratio of the value of the sampling capacitor block and the value of the feedback capacitor block.

2. The ramp signal generator of claim 1, wherein the ramp signal generation unit comprises:
    a reset control block suitable for outputting a switch control signal to the voltage overlapping unit according to a reset control signal;
    a ramp signal generation block suitable for generating the ramp signal and applying the generated ramp signal to the voltage overlapping unit; and a gain control block suitable for outputting a capacitor control signal to the voltage overlapping unit according to a gain control signal.

3. The ramp signal generator of claim 2, wherein the reset control block generates the switch control signal for turning on or off a reset switch and an initialization switch of the voltage overlapping unit according to the reset control signal, and controls the reset switch and the initialization switch.

4. The ramp signal generator of claim 2, wherein the gain control block generates the capacitor control signal for controlling a feedback capacitor value and a sampling capacitor value of the voltage overlapping unit or controlling the feedback capacitor value according to the gain control signal, and outputs the generated capacitor control signal to first and second feedback capacitors and first and second sampling capacitors, which are included in the voltage overlapping unit, or to the first and second feedback capacitors.

5. The ramp signal generator of claim 1, wherein the overlap voltage generation unit generates replica noise corresponding to power noise or an offset voltage, which is to be overlapped with the ramp signal, and applies the generated replica noise to the voltage overlapping unit.

6. The ramp signal generator of claim 1, wherein the voltage overlapping unit controls the voltage gain by amplifying the ramp signal at a ratio of a capacitor value controlled according to the gain amplification control signal, and overlaps the overlap voltage with the ramp signal.

7. The ramp signal generator of claim 1, wherein the voltage overlapping unit includes a voltage buffer or a programmable gain amplifier.

8. The ramp signal generator of claim 1, wherein the sampling capacitor block has a sampling capacitor value controlled according to the capacitor control signal from the ramp signal generation unit or a fixed sampling capacitor value.

9. The ramp signal generator of claim 1, wherein the differential amplifier is initialized to a level of the common mode voltage inputted to the other terminal thereof as the switching block is turned on, and amplifies the ramp signal according to the ratio of the value of the sampling capacitor block and the value of the feedback capacitor block when the ramp signal sampled through the sampling capacitor block is inputted to one terminal and the other terminal thereof.

10. The ramp signal generator of claim 1, wherein the voltage overlapping unit overlaps the applied overlap voltage with the ramp signal, regardless of a gain.

11. A CMOS image sensor comprising:
a pixel array suitable for generating a pixel signal;
a ramp signal generation unit suitable for generating a ramp signal and a gain amplification control signal;
an overlap voltage generation unit suitable for generating an overlap voltage to be overlapped with the ramp signal;
a voltage overlapping unit suitable for controlling a voltage gain by amplifying the ramp signal according to the gain amplification control signal, and overlapping the overlap voltage with the ramp signal; and
a comparison unit suitable for comparing the pixel signal to the ramp signal that is overlapped with the overlap voltage,
wherein the voltage overlapping unit comprises:
a switching block suitable for initializing a differential amplifier to a common mode voltage provided from a variable common mode voltage generation unit according to a switch control signal from the ramp signal generation unit;
a feedback capacitor block having a feedback capacitor value, which is controlled according to a capacitor control signal from the ramp signal generation unit;
a sampling capacitor block suitable for sampling the ramp signal; and
said differential amplifier suitable for amplifying the ramp signal sampled through the sampling capacitor according to the ratio of the value of the sampling capacitor block and the value of the feedback capacitor block.

12. The CMOS image sensor of claim 11, wherein the ramp signal generation unit comprises:
a reset control block suitable for outputting a switch control signal to the voltage overlapping unit according to a reset control signal;
a ramp signal generation block suitable for generating the ramp signal and applying the generated ramp signal to the voltage overlapping unit; and
a gain control block suitable for outputting a capacitor control signal to the voltage overlapping unit according to a gain control signal.

13. The CMOS image sensor of claim 11, wherein the overlap voltage generation unit generates replica noise corresponding to power noise of a pixel, which is to be overlapped with the ramp signal, and applies the generated power noise to the voltage overlapping unit.

14. The CMOS image sensor of claim 11, wherein the voltage overlapping unit includes a voltage buffer or a programmable gain amplifier.

15. A CMOS image sensor comprising:
a pixel array suitable for generating a pixel signal;
a ramp signal generator suitable for generating a ramp signal by using replica noise, which copies noise of the pixel array; and
a comparison unit suitable for comparing the pixel signal to the ramp signal that is overlapped with the overlap voltage,
wherein the ramp signal generator, comprising:
a ramp signal generation unit suitable for generating a ramp signal and a gain amplification control signal;
an overlap voltage generation unit suitable for generating an overlap voltage according to the to be overlapped with the ramp signal; and
a voltage overlapping unit suitable for controlling a voltage gain by amplifying the ramp signal according to the gain amplification control signal, and overlapping the overlap voltage with the ramp signal,
wherein the ramp signal generation unit comprises:
a reset control block suitable for outputting a switch control signal to the voltage overlapping unit according to a reset control signal;
a ramp signal generation block suitable for generating the ramp signal and applying the generated ramp signal to the voltage overlapping unit; and
a gain control block suitable for outputting a capacitor control signal to the voltage overlapping unit according to a gain control signal, wherein the gain control block generates the capacitor control signal for controlling a feedback capacitor value and a sampling capacitor value of the voltage overlapping unit or controlling the feedback capacitor value according to the gain control signal, and outputs the generated capacitor control signal to first and second feedback capacitors and first and second sampling capacitors, which are included in the voltage overlapping unit, or to the first and second feedback capacitors.

\* \* \* \* \*